(12) United States Patent
Sato

(10) Patent No.: US 11,318,572 B2
(45) Date of Patent: May 3, 2022

(54) ELECTROSTATIC CHUCK DEVICE

(71) Applicant: SUMITOMO OSAKA CEMENT CO., LTD., Tokyo (JP)

(72) Inventor: Takashi Sato, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 17/258,999

(22) PCT Filed: Jul. 19, 2019

(86) PCT No.: PCT/JP2019/028389
§ 371 (c)(1),
(2) Date: Jan. 8, 2021

(87) PCT Pub. No.: WO2020/066237
PCT Pub. Date: Apr. 2, 2020

(65) Prior Publication Data
US 2021/0268616 A1    Sep. 2, 2021

(30) Foreign Application Priority Data

Sep. 27, 2018  (JP) .............................. JP2018-181591

(51) Int. Cl.
*H01T 23/00* (2006.01)
*B23Q 3/15* (2006.01)
*H01L 21/683* (2006.01)

(52) U.S. Cl.
CPC ............ *B23Q 3/15* (2013.01); *H01L 21/6833* (2013.01)

(58) Field of Classification Search
None
See application file for complete search history.

(56) References Cited

U.S. PATENT DOCUMENTS

2004/0173161 A1* 9/2004 Mariner .............. C23C 16/4581
                                                                  118/728
2005/0014628 A1* 1/2005 Yoshikawa ........... C04B 35/581
                                                                  501/95.2
(Continued)

FOREIGN PATENT DOCUMENTS

JP         05-206254 A      8/1993
JP       2002-141404 A      5/2002
(Continued)

OTHER PUBLICATIONS

International Search Report for PCT/JP2019/028389 (dated Sep. 24, 2019).

(Continued)

*Primary Examiner* — Stephen W Jackson
(74) *Attorney, Agent, or Firm* — Merchant & Gould P.C.

(57) ABSTRACT

An electrostatic chuck device (1) including: an electrostatic chuck member (2) formed of ceramics; a temperature control base member (3) formed of metal; and a power supply terminal (16) which is inserted in the temperature control base member (3) and applies a voltage to an electrode for electrostatic attraction (13) which is provided on the electrostatic chuck member (2), the electrode for electrostatic attraction (13) and the power supply terminal (16) are connected with each other via a conductive adhesive layer (17), the conductive adhesive layer (17) contains a carbon fiber and a resin, and the carbon fiber has an aspect ratio of 100 or higher.

11 Claims, 2 Drawing Sheets

(56) References Cited

U.S. PATENT DOCUMENTS

2008/0099732 A1    5/2008   Nagao et al.
2015/0069910 A1    3/2015   Iwata et al.

FOREIGN PATENT DOCUMENTS

| JP | 2004349663 A | * | 12/2004 |
|---|---|---|---|
| JP | 2005-012143 A | | 1/2005 |
| JP | 2005-264134 A | | 9/2005 |
| JP | 2006-111870 A | | 4/2006 |
| JP | 2006-225648 A | | 8/2006 |
| JP | 2010027652 A | * | 2/2010 |
| JP | 2012-039011 A | | 2/2012 |
| JP | 2014-051604 A | | 3/2014 |
| JP | 2015-053384 A | | 3/2015 |
| JP | 2017-188648 A | | 10/2017 |

OTHER PUBLICATIONS

Office Action for Japanese Patent Application No. 2018-181591 (dated Oct. 29, 2019).

\* cited by examiner

ELECTROSTATIC CHUCK DEVICE

TECHNICAL FIELD

The present invention relates to an electrostatic chuck device.

This application is a U.S. National Stage Application under 35 U.S.C. § 371 of International Patent Application No. PCT/JP2019/028389, filed on Jul. 19, 2019, which claims benefit of priority to Japanese Patent Application No. 2018-181591 filed on Sep. 27, 2018, the disclosures of all of which are hereby incorporated by reference in their entireties.

BACKGROUND

Conventionally, in a semiconductor manufacturing process for manufacturing semiconductor devices such as IC, LSI, and VLSI, plate-shaped samples such as a silicon wafer is fixed to an electrostatic chuck member having an electrostatic chuck function by electrostatic attraction, and is subjected to predetermined treatment.

However, for example, in a case where etching treatment and the like are performed to this plate-shaped sample in a plasma atmosphere, the temperature of a surface of the plate-shaped sample is increased by heat of plasma. Therefore, problems such as a tear (bursting) of a resist film on the surface may be generated.

Thus, an electrostatic chuck device having a feature of maintaining the temperature of the plate-shaped sample at a desired constant temperature is used in order to prevent the above problems from being generated. Such an electrostatic chuck device is a device in which a temperature control base member that has a flow channel for circulating a cooling medium for temperature control formed inside a metal member is bonded and integrated with a lower surface of the electrostatic chuck member via an adhesive layer constituted of a silicone-based adhesive.

In the electrostatic chuck device, the flow channel of the temperature control base member allows a cooling medium for temperature control to be circulated to exchange heat. In this way, the plate-shaped sample is electrostatically attracted while the temperature of the plate-shaped sample fixed on an upper surface of the electrostatic chuck member is maintained at a preferred constant temperature, and various kinds of plasma treatment are performed on this plate-shaped sample.

In the electrostatic chuck device, thermal stress is repeatedly applied to the adhesive layer that bonds the electrostatic chuck member to the temperature control base member. Thereby, a shearing force may be generated in a direction in which the electrostatic chuck member and the temperature control base member are misaligned from each other. In a case where the shearing force is generated, a cohesive failure of the adhesive layer occurs, so that an electrostatic attraction force in the electrostatic chuck member decreases.

As a method in order to solve the above problems, for example, it is known to provide a space between an electrostatic attraction electrode of a metal layer and a power supply terminal to reduce stress and load on the electrode and a dielectric layer (for example, refer to Patent Literature 1).

In addition, for example, it is known that a structure in which a recessed portion (power supply hole) is provided on a placement plate, and the recessed portion is filled with a filler-based conductive adhesive to bond a power supply terminal to an electrode inside the placement plate is provided, and thereby, compressive stress or tensile stress generated in the recessed portion is alleviated (see, for example, Patent Literature 2).

In addition, for example, it is known that a difference in thermal expansion between the ceramic plate and a power supply terminal, and an elastic modulus of a conductive adhesive is specified, and thereby cracks are prevented from being generated in a ceramic plate even though a thermal cycle is applied (see, for example, Patent Literature 3).

CITATION LIST

Patent Literature

[Patent Literature No. 1] Japanese Laid-open Patent Publication No. 2012-039011
[Patent Literature No. 2] Japanese Laid-open Patent Publication No. 2005-012143
[Patent Literature No. 3] Japanese Laid-open Patent Publication No. 2002-141404

SUMMARY OF INVENTION

Technical Problem

However, in the methods described in Patent Literatures 1 to 3, there is a problem that a cohesive failure of the conductive adhesive gradually occurs due to thermal stress as the time when the electrostatic chuck device is used is lengthened, so that the electrostatic attraction force of the electrostatic chuck device decreases.

The present invention has been made in view of the above circumstances, and an object thereof is to provide an electrostatic chuck device that prevents a cohesive failure of a conductive adhesive due to repeated use.

Solution to Problem

In order to solve the above problems, in a first aspect of the present invention, there is provided an electrostatic chuck device including: an electrostatic chuck member formed of ceramics; a temperature control base member formed of metal; and a power supply terminal which is inserted in the temperature control base member and applies a voltage to an electrode for electrostatic attraction which is provided on the electrostatic chuck member, in which the electrode for electrostatic attraction and the power supply terminal are connected with each other via a conductive adhesive layer, the conductive adhesive layer contains a carbon fiber and a resin, and the carbon fiber has an aspect ratio of 100 or higher.

In the first aspect of the present invention, the carbon fiber may have a fiber diameter of 10 nm or higher and 200 nm or lower, and a fiber length of 5 μm or higher and 200 μm or lower.

In the first aspect of the present invention, the carbon fiber may have an aspect ratio of 220 or lower.

In the first aspect of the present invention, a content of the carbon fibers in the conductive adhesive layer may be 4% by volume or more and 15% by volume or less.

In the first aspect of the present invention, the resin may be a silicone resin.

In the first aspect of the present invention, the conductive adhesive layer has 1000 Ω·cm or lower of a volume resistivity at room temperature, 1 MPa or higher and 10 MPa or lower of a shearing strength at 150° C., and 100% or more and 400% or less of a strain amount.

Advantageous Effects of Invention

According to the present invention, it is possible to provide an electrostatic chuck device that prevents a cohesive failure of a conductive adhesive due to repeated use.

DESCRIPTION OF EMBODIMENTS

Figure 1:
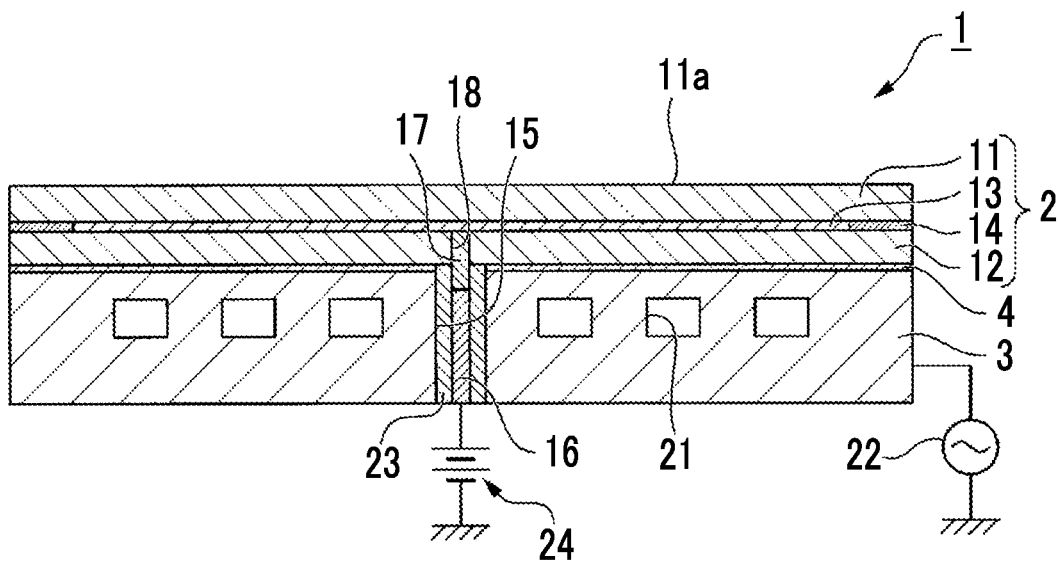
FIG. 1 is a schematic cross-sectional view showing a preferable example of an electrostatic chuck device according to a first embodiment.

An embodiment of an electrostatic chuck device of the present invention will be described.

The present embodiments are specifically described for better understanding of the gist of the invention, and the present invention is not limited unless otherwise specified.

In the drawings used in the following description, for the purpose of emphasizing characteristic portions, the characteristic portions may be enlarged for convenience, and dimensional ratios and the like of the respective components are not necessarily the same as the actual ratios. In addition, for the same purpose, non-characteristic parts may be omitted in the drawings. The number, position, size, numerical value, ratio, and the like can be changed, omitted, or added without departing from the scope of the present invention.

First Embodiment

<Electrostatic Chuck Device>

Hereinafter, with reference to FIG. 1, an electrostatic chuck device according to the present embodiment will be described.

In all the following drawings, in order to facilitate visualization of the drawings, the dimensions, ratios, and the like of the respective components are varied as appropriate.

FIG. 1 is a cross-sectional view showing an electrostatic chuck device according to an embodiment of the present invention. As shown in FIG. 1, an electrostatic chuck device 1 includes a disk-shaped electrostatic chuck member 2 in a plan view, a disk-shaped temperature control base member 3 for adjusting the electrostatic chuck member 2 to have the desired temperature, and an adhesive layer 4 for bonding and integrating the electrostatic chuck member 2 with the temperature control base member 3.

In the following description, a side on which a placement surface 11a of a placement plate 11 is disposed is described as an "upper" and a side on which the temperature control base member 3 is disposed is described as a "lower", and relative positions of respective components may be represented.

[Electrostatic Chuck Member]

The electrostatic chuck member 2 includes: the placement plate 11 formed of ceramics whose upper surface is used as the placement surface 11a on which a plate-shaped sample such as a semiconductor wafer or the like is placed; a supporting plate 12 provided on a surface side opposite to the placement surface 11a of the placement plate 11; an electrode for electrostatic attraction 13 interposed between the placement plate 11 and the supporting plate 12; an annular insulation material 14 surrounds the electrode for electrostatic attraction 13 interposed between the placement plate 11 and the supporting plate 12; and a power supply terminal 16 provided into a fixing hole 15 of the temperature control base member 3 to be in contact with the electrode for electrostatic attraction 13.

[Placement Plate]

A large number of projections for supporting a plate-shaped sample such as a semiconductor wafer can be preferably provided in a standing state on the placement surface 11a of the placement plate 11 (not shown). Furthermore, preferably, as these projections, a quadrangular cross-section-shaped annular projection portion may be provided with a peripheral portion of the placement surface 11a of the placement plate 11 so as to prevent cooling gas such as helium (He) from leaking and to go around the peripheral portion. Furthermore, a plurality of projection portions having the same height as the annular projection portion and having a circular cross-section and a substantially rectangular vertical cross-section may be provided in a region surrounded by the annular projection portion on the placement surface 11a.

The ceramics for preferably forming the placement plate 11 can be optionally selected, and is not particularly limited as long as ceramics has a volume specific resistance value of $10^{13}$ Ω·cm or higher and $10^{15}$ Ω·cm or lower, has mechanical strength, and has durability against corrosive gases and plasma. As such ceramics, for example, an aluminum oxide ($Al_2O_3$) sintered compact, an aluminum nitride (AlN) sintered compact, an aluminum oxide ($Al_2O_3$)-silicon carbide (SiC) composite sintered compact, and the like are suitably used.

A thickness of the placement plate 11 can be optionally selected, and the thickness is preferably 0.3 mm or higher and 3.0 mm or lower, and more preferably 0.5 mm or higher and 1.5 mm or lower. In a case where the thickness of the placement plate 11 is 0.3 mm or higher, voltage resistance is excellent. On the other hand, in a case where the thickness of the placement plate 11 is 3.0 mm or lower, an electrostatic attraction force of the electrostatic chuck member 2 may not decrease. In addition, a thermal conductivity between the plate-shaped sample placed on the placement surface 11a of the placement plate 11 and the temperature control base member 3 may also not decrease, and a temperature of the plate-shaped sample being processed can be maintained at a preferred constant temperature.

[Supporting Plate]

The supporting plate 12 supports the placement plate 11 and the electrode for electrostatic attraction 13 from a lower side.

The supporting plate 12 is preferably formed of the same material as the ceramics for forming the placement plate 11.

A thickness of the supporting plate 12 is preferably 0.3 mm or higher and 3.0 mm or lower, and more preferably 0.5 mm or higher and 1.5 mm or lower. In a case where the thickness of the supporting plate 12 is 0.3 mm or higher, sufficient voltage resistance can be ensured. On the other hand, in a case where the thickness of the supporting plate 12 is 3.0 mm or lower, the electrostatic attraction force of the electrostatic chuck member 2 may not decrease, the thermal conductivity between the plate-shaped sample placed on the placement surface 11a of the placement plate 11 and the temperature control base member 3 may also not decrease, and the temperature of the plate-shaped sample being processed can be maintained at a preferred constant temperature.

[Electrode for Electrostatic Attraction]

In the electrode for electrostatic attraction 13, an electrostatic attraction force for maintaining the plate-shaped sample on the placement surface 11a of the placement plate 11 is generated by applying a voltage.

As materials forming the electrode for electrostatic attraction 13, high-melting point metals such as titanium, tungsten, molybdenum, platinum, and the like, carbon materials such as graphite, carbon, and the like, and a conductive ceramics and the like such as silicon carbide, titanium nitride, titanium carbide, and the like are suitably used. A thermal expansion coefficient of these materials is preferably as close as possible to a thermal expansion coefficient of the placement plate 11.

A thickness of the electrode for electrostatic attraction 13 can be optionally selected, and the thickness is preferably 5 µm or higher and 200 µm or lower, and more preferably 10 µm or higher and 100 µm or lower. In a case where the thickness of the electrode for electrostatic attraction 13 is 5 µm or higher, sufficient conductivity can be ensured. On the other hand, in a case where the thickness of the electrode for electrostatic attraction 13 is 200 µm or lower, the thermal conductivity between the plate-shaped sample placed on the placement surface 11a of the placement plate 11 and the temperature control base member 3 may not decrease, and the temperature of the plate-shaped sample being processed can be maintained at a preferred constant temperature. In addition, plasma permeability may not decrease, and stable plasma can be generated.

The electrode for electrostatic attraction 13 can be formed by a method that is optionally selected, and can be easily formed by a film forming method such as a sputtering method or a vapor deposition method, or a coating method such as a screen printing method.

[Insulating Material]

The insulating material 14 surrounds the electrode for electrostatic attraction 13, and protects the electrode for electrostatic attraction 13 from corrosive gas and plasma thereof.

The insulating material 14 is preferably formed of insulating materials having the same composition or the same main component as the placement plate 11 and the supporting plate 12. The placement plate 11 and the supporting plate 12 are bonded and integrated with each other by using the insulating material 14 via the electrode for electrostatic attraction 13.

[Power Supply Terminal]

The power supply terminal 16 is a terminal for applying a voltage to the electrode for electrostatic attraction 13.

The number of power supply terminals 16, a shape thereof, and the like are determined as necessary depending on a form of the electrode for electrostatic attraction 13, that is, whether the electrode for electrostatic attraction 13 is a monopolar type or a bipolar type.

Materials of the power supply terminal 16 are not particularly limited as long as the materials are conductive materials having excellent heat resistance, and can be selected as necessary. The material of the power supply terminal 16 is preferably a material in which a thermal expansion coefficient is close to the thermal expansion coefficient of the electrode for electrostatic attraction 13 and the supporting plate 12. For example, Kovar alloy, metal materials such as niobium (Nb), and various conductive ceramics are suitably used.

[Conductive Adhesive Layer]

A conductive adhesive layer 17 is provided into the fixing hole 15 of the temperature control base member 3 and a through-hole 18 of the supporting plate 12. In addition, the conductive adhesive layer 17 is interposed between the electrode for electrostatic attraction 13 and the power supply terminal 16 to electrically connect the electrode for electrostatic attraction 13 to the power supply terminal 16.

A conductive adhesive constituting the conductive adhesive layer 17 contains carbon fiber and resins.

The resins are not particularly limited as long as the resins are less likely to cause cohesive failure due to thermal stress, and can be optionally selected. Examples thereof include silicone resins, acrylic resins, epoxy resins, phenol resins, polyurethane resins, unsaturated polyester resins, and the like.

Among these, the silicone resins are preferable from the viewpoint that a degree of expansion and contraction is high and cohesive failure is less likely to be caused due to change in thermal stress.

The carbon fibers can be optionally selected, but carbon nanotubes and the like can be preferably used. The carbon fibers have an aspect ratio (fiber length/fiber diameter) of 100 or higher, preferably have an aspect ratio of 110 or higher, more preferably have an aspect ratio of 125 or higher, even more preferably have an aspect ratio of 150 or higher, and particularly preferably have an aspect ratio of 175 or higher.

In a case where the aspect ratio of the carbon fibers is lower than 100, there are possibilities that contact points of the carbon fibers in the conductive adhesive layer 17 cannot be sufficiently ensured and a volume resistivity may not be sufficiently lowered, which are not preferable.

The carbon fibers preferably have an aspect ratio (fiber length/fiber diameter) of 220 or lower, more preferably have an aspect ratio of 210 or lower, and even more preferably have an aspect ratio of 200 or lower.

In a case where the aspect ratio of the carbon fibers is 220 or lower, contact points between the carbon fibers in the conductive adhesive layer 17 can be sufficiently ensured and a required volume resistivity can be obtained, which are preferable.

The carbon fibers preferably have a fiber diameter of 10 nm or higher and 200 nm or lower, more preferably have a fiber diameter of 30 nm or higher and 180 nm or lower, even more preferably have a fiber diameter of 50 nm or higher and 150 nm or lower, and particularly preferably have a fiber diameter of 75 nm or higher and 125 nm or lower.

In a case where the carbon fiber diameter is 10 nm or higher and 200 nm or lower, since contact points between the carbon fibers can be sufficiently ensured, it is possible to obtain the conductive adhesive layer 17 having a required volume resistivity. In addition, in a case where the carbon fiber diameter is lower than 10 nm, the fiber diameter is too small. Thus, there are possibilities that contact points between the carbon fibers are less likely to be formed, and the required volume resistivity cannot be obtained. On the other hand, in a case where the carbon fiber diameter is higher than 200 nm, the carbon fibers are likely to agglomerate with each other and exist as an agglomerate of the fibers. Thus, there are possibilities that a region where the carbon fibers are not in contact with each other is generated, and as a result, the required volume resistivity cannot be obtained.

The carbon fibers can be optionally selected, and the fiber length is preferably 5 µm or higher and 200 µm or lower, more preferably 8 µm or higher and 140 µm or lower, even more preferably 10 µm or higher and 90 µm or lower, still even more preferably 10 µm or higher and 50 µm or lower, and particularly preferably 10 µm or higher and 30 µm or lower.

In a case where the fiber length of the carbon fiber is 5 nm or higher and 200 nm or lower, since the carbon fiber is connected in a chain shape, it is possible to obtain the conductive adhesive layer 17 having a required volume resistivity even though an amount of addition is small.

In addition, in a case where the fiber length of the carbon fiber is lower than 5 µm, the fiber length is too short. Thus, paths for obtaining sufficient conductivity are not connected to each other. Therefore, the required volume resistivity is not obtained, which is not preferable. On the other hand, in a case where the fiber length of the carbon fiber is higher than 200 µm, the carbon fiber length is too long. Thus, the carbon fibers are likely to agglomerate with each other, and the carbon fibers may exist as agglomerates of fibers. Therefore, there are possibilities that a region where the carbon fibers are not in contact with each other is generated, and as a result, the required volume resistivity cannot be obtained.

In the electrostatic chuck device 1 of the present embodiment, the fiber diameters and the fiber lengths of the carbon fibers for 100 samples are measured with, for example, a scanning electron microscope (trade name: JSM-7500F, and manufactured by JEOL Ltd.), and an average value thereof is used.

A content of the carbon fibers in the conductive adhesive layer 17 can be optionally selected, but may be, for example, 4% by volume or more and 18% by volume or less, preferably 4% by volume or more and 15% by volume or less, more preferably 5% by volume or more and 13% by volume or less, and even more preferably 8% by volume or more and 12% by volume or less.

In a case where the content of the carbon fibers in the conductive adhesive layer 17 is 4% by volume or more, conductive paths in the conductive adhesive layer 17 are sufficiently formed. Thus, it is preferable that a volume resistivity of the conductive adhesive layer 17 can be reduced. On the other hand, in a case where the content of the carbon fibers in the conductive adhesive layer 17 more than 15% by volume, viscosity of the conductive adhesive may rapidly increase, which is not preferable. It is considered that in a case where the content of carbon fibers more than 15% by volume, since a fiber shape is a needle shape, friction between the fibers increases, and a probability in which the fibers become entangled with each other may be significantly improved, so that the viscosity of the adhesive increases.

The volume resistivity of the conductive adhesive layer 17 at room temperature (23° C.) is preferably 1000 Ω·cm or lower, more preferably 100 Ω·cm or lower, and even more preferably 10 Ω·cm or lower.

In a case where the volume resistivity of the conductive adhesive layer 17 at room temperature is 1000 Ω·cm or lower, it is possible to apply a sufficient voltage to the electrode for electrostatic attraction 13. In addition, in a case where the volume resistivity of the conductive adhesive layer 17 at room temperature is higher than 1000 Ω·cm, the volume resistivity is too high. Thus, there are possibilities that the conductive adhesive layer 17 generates heat and a heat singularity is generated, which are not preferable.

The volume resistivity of the conductive adhesive layer 17 is measured as follows.

A conductive adhesive is applied onto a tetrafluoroethylene resin substrate to form a coating film having a thickness after curing of 1 mm and an area of 4 cm$^2$. Then, the coating film is heated at 150° C. for 1 hour to be cured.

A volume resistivity of the cured coating film (conductive adhesive layer 17) can be measured with, for example, a low resistivity meter (trade name: Loresta-GX MCP-T700, manufactured by Mitsubishi Chemical Analytech Co., Ltd.). The volume resistivity of the conductive adhesive layer 17 is measured 5 times, and an average value thereof is calculated and is set as a volume resistivity of the conductive adhesive layer 17.

A shearing strength at 150° C. of the conductive adhesive layer 17 is preferably 1 MPa or higher and 10 MPa or lower, more preferably 1 MPa or higher and 5 MPa or lower, and even more preferably 1 MPa or higher and 3 MPa or lower.

In a case where the shearing strength of the conductive adhesive layer 17 at 150° C. is 1 MPa or higher, it is possible to suppress an occurrence of a cohesive failure of the conductive adhesive layer 17. On the other hand, in a case where the shearing strength of the conductive adhesive layer 17 at 150° C. is 10 MPa or lower, sufficient carbon fibers to obtain conductivity are contained. Thus, the required volume resistivity can be obtained.

The shearing strength of the conductive adhesive layer 17 is measured by methods described in Examples.

A strain amount of the conductive adhesive layer 17 is preferably 100% or more and 400% or less, more preferably 150% or more and 400% or less, and even more preferably 200% or more and 370% or less.

In a case where the strain amount of the conductive adhesive layer 17 is 100% or more and 400% or less, it is possible to suppress the occurrence of the cohesive failure of the conductive adhesive layer 17. In a case where the strain amount of the conductive adhesive layer 17 is less than 100%, the resin may be gradually hardened to cause the cohesive failure. In the conductive adhesive layer 17 having a strain amount of more than 400%, an additional amount of the carbon fibers is small, so that there is a possibility that the required volume resistivity cannot be obtained.

The strain amount of the conductive adhesive layer 17 is measured by methods described in Examples.

[Temperature Control Base Member]

The temperature control base member 3 is a thick disk-shaped member formed of at least one of metal or ceramics. A structural body of the temperature control base member 3 may be configured to also serve as an internal electrode for plasma generation. A flow channel 21 for circulating a cooling medium such as water, He gas, N$_2$ gas, or the like is formed inside the structural body of the temperature control base member 3.

The structural body of the temperature control base member 3 is connected to an external high frequency power source 22. In addition, a power supply terminal 16 whose outer periphery is surrounded by an insulating material 23 is fixed into the fixing hole 15 of the temperature control base member 3 via the insulating material 23. The power supply terminal 16 is connected to an external direct-current power supply 24.

The materials forming the temperature control base member 3 are not particularly limited and can be optionally selected, as long as the materials are metals having excellent thermal conductivity, conductivity, and processability, or compound materials containing these metals. As materials forming the temperature control base member 3, for example, aluminum (Al), copper (Cu), stainless steel (SUS), titanium (Ti), or the like is suitably used.

At least a surface of the temperature control base member 3 exposed to plasma is preferably subjected to alumite treatment or a resin-coating with a polyimide-based resin. In addition, the entire surface of the temperature control base member 3 is preferably subjected to the alumite treatment or the resin-coating.

The alumite treatment or the resin coating is performed on the temperature control base member 3, whereby plasma resistance of the temperature control base member 3 is improved and an abnormal discharge is prevented. Therefore, stability of the plasma resistance in the temperature control base member 3 is improved, and surface scratches on the temperature control base member 3 can be prevented from occurring.

[Adhesive Layer]

The adhesive layer 4 is used for bonding and integrating the electrostatic chuck portion 2 with the base portion 3 which is used for cooling.

A thickness of the adhesive layer 4 can be optionally selected, and is preferably 100 μm or higher and 200 μm or lower, and more preferably 130 μm or higher and 170 μm or lower.

In a case where the thickness of the adhesive layer 4 is within the above range, an adhesive strength between the electrostatic chuck portion 2 and the cooling base portion 3 can be sufficiently maintained. Furthermore, sufficient thermal conductivity between the electrostatic chuck portion 2 and the cooling base portion 3 can be ensured.

The adhesive layer 4 is formed of materials that are optionally selected, and examples thereof include a cured body obtained by heating and curing a silicone-based resin composition, an acrylic resin, an epoxy resin, and the like.

The silicone-based resin composition is preferably a silicon compound having a siloxane bond (Si—O—Si) since a resin has excellent heat resistance and elasticity.

As such a silicone-based resin composition, a silicone resin having a thermosetting temperature of 70° C. to 140° C. is particularly preferable.

Here, in a case where the thermosetting temperature is lower than 70° C., the curing is not sufficiently performed in a bonding process when the electrostatic chuck portion 2 and the cooling base portion 3 are bonded in a state of being opposed to each other. Therefore, there is a possibility that workability deteriorates, which is not preferable. On the other hand, in a case where the thermosetting temperature higher than 140° C., a difference in thermal expansion between the electrostatic chuck portion 2 and the cooling base portion 3 is large, and stress between the electrostatic chuck portion 2 and the cooling base portion 3 increases. Therefore, there is a possibility that peeling may occur therebetween, which is not preferable.

As the silicone resin, a resin having a Young's modulus of 8 MPa after curing or lower is preferable. Here, in a case where the Young's modulus after curing is higher than 8 MPa, the difference in thermal expansion between the electrostatic chuck portion 2 and the cooling base portion 3 cannot be offset when a thermal cycle of a temperature increase and a temperature decrease is applied to the adhesive layer 4. Therefore, there is a possibility that durability of the adhesive layer 4 is reduced, which is not preferable.

Physical properties of the silicone resin can be optionally selected as necessary. For example, as electrical properties, a volume low efficiency (Ω·cm) may be in a range of $1 \times 10^{14}$ to $8 \times 10^{16}$, may be in a range of $1 \times 10^{14}$ to $1 \times 10^{16}$, may be in a range of $5 \times 10^{14}$ to $5 \times 10^{15}$, or may be in a range of $1 \times 10^{15}$ to $5 \times 10^{15}$. A relative permittivity (60 Hz) may be 2.4 to 5.0, or may be 2.6 to 4.5, 2.7 to 4.3, or 2.8 to 3.0. A dielectric dissipation factor (60 Hz) may be 0.0001 to 0.030, may be 0.001 to 0.020, or may be 0.005 to 0.010. A tensile strength (MPa) may be 1.8 to 3.5, may be 2.0 to 3.2, or may be 2.2 to 2.8 or 2.3 to 2.6. However, these physical properties are not limited only to values.

The adhesive layer 4 may include a filler and the like. For example, the adhesive layer 4 may contain a filler formed of inorganic oxide, inorganic nitride, or inorganic oxynitride, which has an average particle diameter of 1 μm or higher and 30 μm or lower, preferably 1 μm or higher and 20 μm or lower, and more preferably 1 μm or higher and 10 μm or lower. A coating layer may be included. For example, contain surface-coated aluminum nitride (AlN) particles on which a coating layer consisting of silicon oxide ($SiO_2$) is formed on surfaces of aluminum nitride (AlN) particles are preferably contained in the adhesive layer.

The surface-coated aluminum nitride (AlN) particles are mixed in order to improve a thermal conductivity of the silicone resin, and a heat transfer coefficient of the adhesive layer 4 can be controlled by adjusting a mix rate thereof.

That is, the mix rate of the surface-coated aluminum nitride (AlN) particles is increased, so that the heat transfer coefficient of an organic adhesive forming the adhesive layer 4 can be increased.

In addition, in the particles, a coating layer consisting of silicon oxide ($SiO_2$) is formed on the surfaces of the aluminum nitride (AlN) particles. Therefore, the coating layer has excellent water resistance as compared with mere aluminum nitride (AlN) particles on which the surfaces are not coated. Therefore, the durability of the adhesive layer 4 containing the silicone-based resin composition as a main component can be ensured, and as a result, the durability of the electrostatic chuck device 1 can be significantly improved.

For example, in the surface-coated aluminum nitride (AlN) particles, surfaces of aluminum nitride (AlN) particles are coated with a coating layer consisting of silicon oxide ($SiO_2$) having excellent water resistance. Thus, aluminum nitride (AlN) is not hydrolyzed by water in the atmosphere, and the heat transfer coefficient of aluminum nitride (AlN) is not reduced. Therefore, the durability of the adhesive layer 4 is improved.

The surface-coated aluminum nitride (AlN) particles are not subjected to a contaminant source for the plate-shaped sample W such as a semiconductor wafer as well. From this point, the above described particles can be preferable fillers.

In addition, the adhesive layer 4 may be formed of a thermosetting acrylic resin adhesive having a Young's modulus of 1 GPa or lower and flexibility (Shore hardness of A100 or lower). In this case, the filler may or may not be contained.

According to the electrostatic chuck device 1 of the present embodiment, the electrode for electrostatic attraction 13 and the power supply terminal 16 are connected with each other via the conductive adhesive layer 17, the conductive adhesive layer 17 contains carbon fibers and resins, and the carbon fiber has an aspect ratio of 100 or higher. Therefore, even though the content of carbon fibers in the conductive adhesive layer 17 is low, the conductive adhesive layer 17 having high conductivity and strong shearing stress (that is, a soft state of following the shearing stress is maintained) is obtained. Therefore, the electrostatic chuck device 1 that prevents a cohesive failure of the conductive adhesive layer 17 due to repeated use over a long period is obtained.

Hereinafter, a preferable example of a method of manufacturing an electrostatic chuck device according to the present embodiment will be described.

Firstly, a pair of plate-shaped bodies serving as the placement plate 11 and the supporting plate 12 are prepared from an aluminum oxide-silicon carbide ($Al_2O_3$—SiC) composite sintered compact or an yttrium oxide ($Y_2O_3$) sintered compact.

For example, first, a mixed powder containing a silicon carbide powder and an aluminum oxide powder, or an yttrium oxide powder is formed into a desired shape to obtain two molded bodies.

Thereafter, the molded bodies are calcinated at a temperature of about 1400° C. to 2000° C. in a non-oxidative atmosphere, preferably in an inert atmosphere for a predetermined time. Thereby, a pair of plate-shaped bodies (a first plate-shaped body and a second plate-shaped body) can be obtained.

Next, the through-hole 18 for which the conductive adhesive layer 17 is formed is formed on the first plate-shaped body that is the supporting plate 12.

Next, a coating liquid for forming an internal electrode for electrostatic attraction, preferably a coating liquid for forming an internal electrode for electrostatic attraction in which a conductive material such as the above described conductive ceramics is dispersed in an organic solvent, is applied to a predetermined region of a surface of the first plate-shaped body. The coated first plate-shaped body is dried to form a layer of an internal electrode for electrostatic attraction. Furthermore, an insulating material layer containing powder materials having the same composition or the same main component as the plate-shaped body is formed in a region other than the region where the layer of an internal electrode for electrostatic attraction is formed on the plate-shaped body.

Next, an other second plate-shaped body that is the placement plate 11 is overlapped on the layer of an internal electrode for electrostatic attraction and the insulating material layer, which are formed on one first plate-shaped body. The resultant layer is integrated by hot pressing under high temperature and high pressure. The atmosphere in the hot pressing is preferably a vacuum or an inert atmosphere such as Ar, He, or $N_2$.

Furthermore, the pressure when uniaxial pressing is performed in the hot pressing can be optionally selected, but is preferably 5 MPa to 10 MPa, and the temperature is preferably 1400° C. to 1850° C.

By the hot pressing, the layer of an internal electrode for electrostatic attraction is calcinated to form an internal electrode for electrostatic attraction 13 formed of a conductive composite sintered compact. At the same time, the two plate-shaped bodies each become the placement plate 11 and the supporting plate 12 and are bonded and integrated with the internal electrode for electrostatic attraction 13 and the insulating material layer 14 to form the electrostatic chuck portion 2.

Next, the through-hole 18 of the supporting plate 12 was filled with a conductive adhesive.

Next, the power supply terminal 16 was bonded to the electrode for electrostatic attraction 13 of the supporting plate 12 via the conductive adhesive. In this case, the conductive adhesive was heated, the conductive adhesive was cured, and thereby the conductive adhesive layer 17 is formed.

Next, an adhesive consisting of a silicone-based resin composition is applied to a predetermined region of one main surface 3a of the cooling base portion 3. Here, an application amount of the adhesive is adjusted so that the electrostatic chuck portion 2 and the cooling base portion 3 can be bonded and integrated with each other.

Examples of a method for applying the adhesive include a bar coating method, a screen printing method, and the like in addition to an application method using a spatula or the like by hand.

After applying the adhesive to the one main surface 3a of the cooling base portion 3, the electrostatic chuck portion 2 and the cooling base portion 3 to which the adhesive is applied are overlapped.

In addition, in this case, the power supply terminal 16 is inserted and fitted into the fixing hole 15 drilled through the cooling base portion 3. In a fitted state, the power supply terminal 16 is covered with the insulating material 23.

Next, the electrostatic chuck portion 2 is pressed against the cooling base portion 3 with a predetermined pressure. As a result, the electrostatic chuck portion 2 and the cooling base portion 3 are bonded and integrated with each other. As a result, the electrostatic chuck portion 2 and the cooling base portion 3 are bonded and integrated with each other via the adhesive layer 4.

As described above, the electrostatic chuck device 1 of the present embodiment, in which the electrostatic chuck portion 2 and the cooling base portion 3 are bonded and integrated with each other via the adhesive layer 4, is obtained.

The plate-shaped sample according to the present embodiment is not limited to a semiconductor wafer, and for example, the plate-shaped sample may be a glass substrate for a flat panel display (FPD) such as a liquid crystal display (LCD), a plasma display (PDP), an organic EL display, or the like. In addition, the electrostatic chuck device of the present embodiment may be designed according to a shape and size of the substrate.

(2) Second Embodiment

<Electrostatic Chuck Device>

Figure 2:
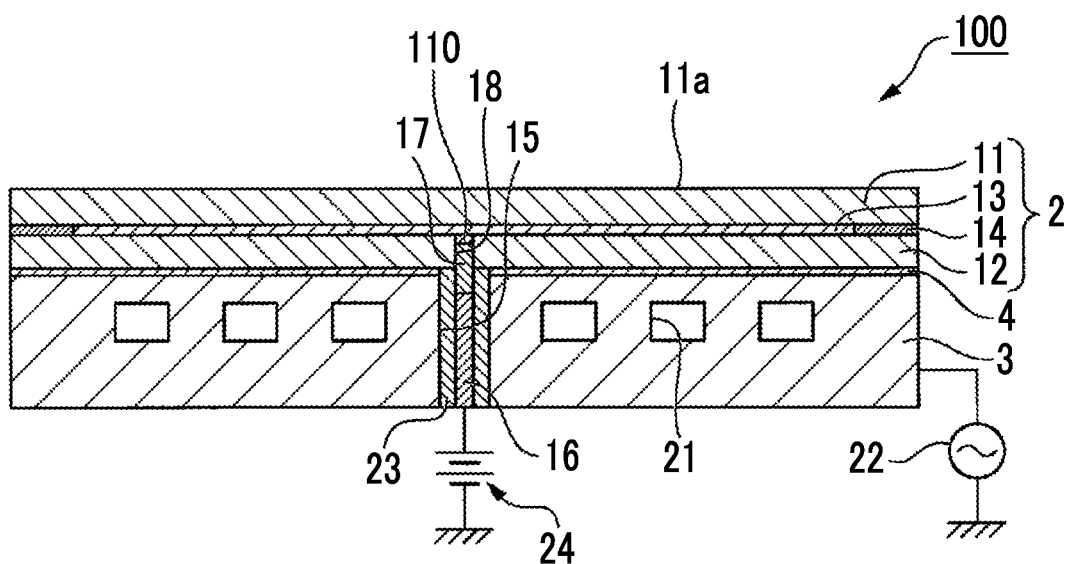
FIG. 2 is a schematic cross-sectional view showing a preferable example of an electrostatic chuck device according to a second embodiment.

FIG. 2 is a cross-sectional view showing an electrostatic chuck device according to the present embodiment. In FIG. 2, the same components as the electrostatic chuck device according to the first embodiment shown in FIG. 1 are denoted by the same reference numerals, and duplicate descriptions will not be repeated.

As shown in FIG. 2, an electrostatic chuck device 100 includes a disk-shaped electrostatic chuck member 2 in a plan view, a disk-shaped temperature control base member 3 for adjusting the electrostatic chuck member 2 to have a desired temperature, and an adhesive layer 4 for bonding and integrating the electrostatic chuck member 2 with the temperature control base member 3.

The electrostatic chuck device 100 of the present embodiment is different from the electrostatic chuck device 1 of the first embodiment described above in that, as shown in FIG. 2, in a through-hole 18 of a supporting plate 12, an electrode-side power supply terminal for electrostatic attraction 110 is interposed between a conductive adhesive layer 17 and an electrode for electrostatic attraction 13.

The electrode-side power supply terminal for electrostatic attraction 110 is formed of the same material as a power supply terminal 16.

A thickness of the electrode-side power supply terminal for electrostatic attraction 110 is not particularly limited and can be optionally selected, but is the thickness of the supporting plate 12 or less. It is preferable that an upper surface thereof is preferably positioned on the same plane as the support 12 of the electrostatic chuck member 2. The electrode-side power supply terminal for electrostatic attraction 110 is an electrode-side power supply terminal for electrostatic attraction for ensuring conduction between the electrode for electrostatic attraction 13 and the power supply terminal 16. Therefore, in a case of using the conductive adhesive layer 17 between the electrode for electrostatic attraction 13 and the power supply terminal 16, conductivity and alleviation of thermal stress are excellent, so that the electrode-side power supply terminal for electrostatic attraction 110 may be omitted.

In addition, in a case where the electrode-side power supply terminal for electrostatic attraction 110 more protrudes than the supporting plate 12, workability is deteriorated such that when the electrode-side power supply terminal for electrostatic attraction 110 comes into contact with the cooling base 3, damage due to the contact is generated. Therefore, such a configuration is not preferable.

According to the electrostatic chuck device 100 of the present embodiment, the electrode-side power supply terminal for electrostatic attraction 110 is interposed between the conductive adhesive layer 17 and the electrode for electrostatic attraction 13. Therefore, even though the content of carbon fibers in the conductive adhesive layer 17 is low, the conductive adhesive layer 17 having high conductivity and strong shearing stress (that is, a soft state of following the shearing stress is maintained) can be used. Therefore, the electrostatic chuck device 100 that prevents a cohesive failure of the conductive adhesive layer 17 due to repeated use over a long period is obtained.

EXAMPLES

Hereinafter, the present invention will be described more specifically with reference to Examples and Comparative Examples, but the present invention is not limited to the following Examples.

Example 1

(Preparation of Conductive Adhesive)

4% by volume of a carbon nanotube (CNT, fiber diameter: 80 nm, fiber length 10 μm, aspect ratio (fiber length/fiber diameter): 125) were added to 96% by volume of a silicone resin (trade name: TSE-3221, manufactured by Momentive Performance Materials Japan LLC). A composition of the silicone resins and the carbon nanotubes was kneaded for 10 minutes with a planetary centrifugal mixer (trade name: Awatori Rentaro, manufactured by Thinky Corporation) to obtain a conductive adhesive of Example 1.

100 carbon nanotubes are selected, and the fiber diameters and the fiber lengths of the 100 samples are measured with a scanning electron microscope (trade name: JSM-7500F, and manufactured by JEOL Ltd.), and an average value thereof is used.

(Measurement of Volume Resistivity of Conductive Adhesive Layer)

A conductive adhesive was applied onto a tetrafluoroethylene resin substrate to form a coating film having a thickness after curing of 1 mm and an area of 4 cm². Then, the coating film was heated at 150° C. for 1 hour to be cured.

A volume resistivity of the cured coating film (conductive adhesive layer) was measured with a low resistivity meter (trade name: Loresta-GX MCP-T700, manufactured by Mitsubishi Chemical Analytech Co., Ltd.).

The volume resistivity of the coating film was measured 5 times, and an average value thereof was calculated. An environmental temperature when measuring the volume resistivity of the coating film was room temperature (23° C.). The results are shown in Table 1.

(Measurement of Shearing Strength and Strain Amount of Conductive Adhesive Layer)

Figure 3:
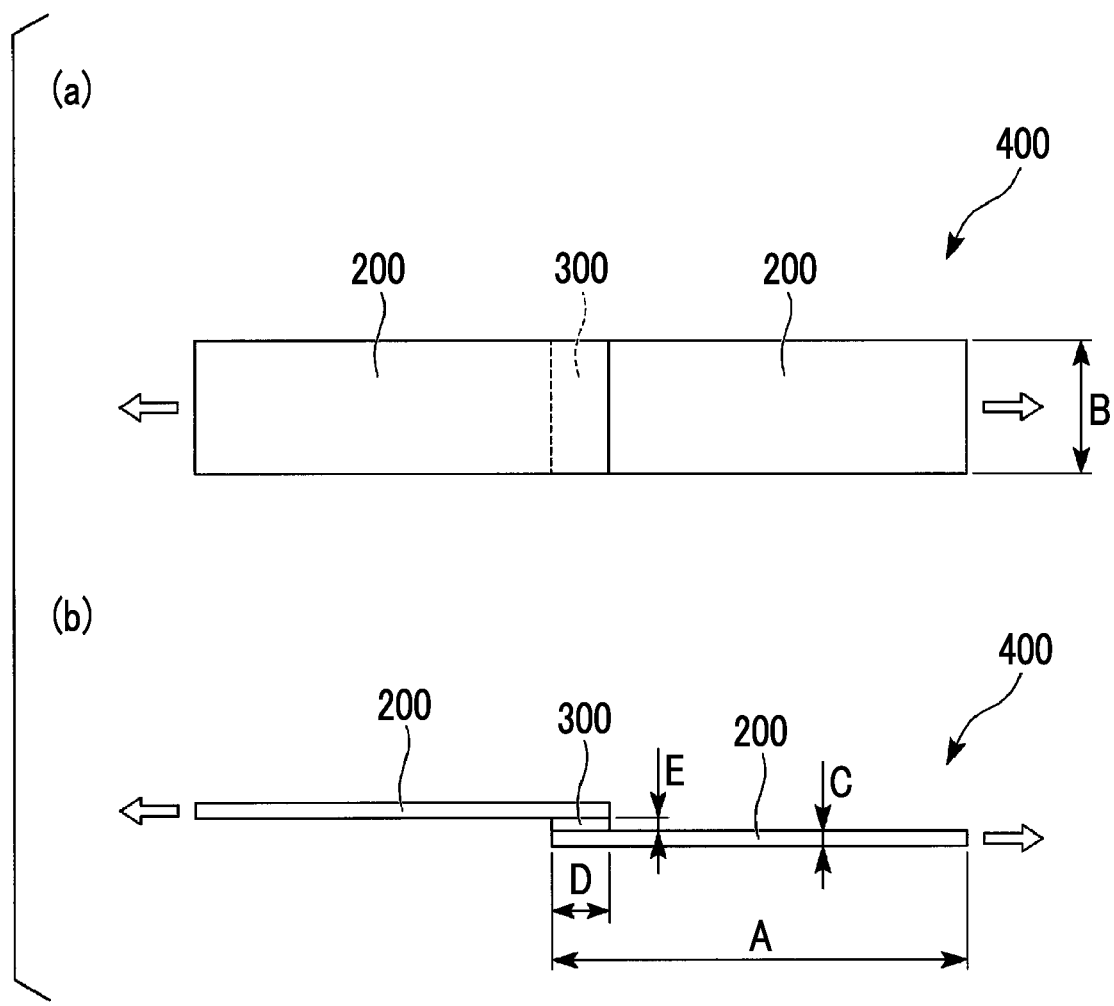
FIG. 3 is a diagram illustrating a method of measuring a shearing strength and a strain amount of a conductive adhesive layer, (a) is a plan view of a sample, and (b) is a side view of the sample.

As shown in FIG. 3, two rectangular adherends 200 and 200 having a length (A shown in FIG. 3) of 60 mm, a width (B shown in FIG. 3) of 25 mm, and a thickness (C shown in FIG. 3) of 4.9 mm was prepared. Then, these adherends were bonded as shown in the figure via the conductive adhesive layer 300 formed of the above conductive adhesive.

The two adherends 200, 200 were overlapped via a conductive adhesive. Thereafter, the conductive adhesive was heated at 150° C. for 1 hour and was cured, and thereby the conductive adhesive layer 300 was formed. As a result, the two adherends 200 and 200 were adhered to each other via the conductive adhesive layer 300 to obtain a shearing test sample 400.

A length (D shown in FIG. 3) of the conductive adhesive layer 300 was 8 mm, a width (B shown in FIG. 3) of the conductive adhesive layer 300 was 25 mm, and a thickness (E shown in FIG. 3) of the conductive adhesive layer 300 was 0.2 mm.

The shearing test sample 400 was pulled in a direction of arrows shown in FIG. 3 (a direction perpendicular to a thickness direction of the shearing test sample 400)) at a tension rate of 1 mm/min to obtain a stress-strain curve until the conductive adhesive layer 300 was broken, by using a tensile tester (trade name: 5582 type universal material testing machine, manufactured by Instron corporation). An environmental temperature when pulling the shearing test sample 400 was set to 150° C.

A shearing strength of the conductive adhesive layer 300 was set to a maximum value of the obtained stress in the measurement for obtaining the stress-strain curve. A strain amount of the conductive adhesive was calculated from an amount of displacement in the measurement for obtaining the stress-strain curve (an amount of displacement of the conductive adhesive layer 300 in the direction perpendicular to the thickness direction of the shearing test sample 400) and a thickness of the conductive adhesive layer 300. A value in the maximum value of the stress in the measurement for obtaining the stress-strain curve was set to a strain amount of the conductive adhesive layer 300. The results are shown in Table 1.

(Preparation of Electrostatic Chuck Device)

According to a known method, an electrostatic chuck member in which a placement plate and a supporting plate were included and an internal electrode for electrostatic attraction having a thickness of 10 μm was embedded was prepared. Specifically, the electrostatic chuck member was formed as follows. First, the placement plate and the supporting plate were prepared.

The placement plate used for the electrostatic chuck member was an aluminum oxide-silicon carbide composite sintered compact containing 8.5% by mass of silicon carbide, and had a disk-shape having a diameter of 320 mm and a thickness of 4.0 mm.

The supporting plate was also an aluminum oxide-silicon carbide composite sintered compact containing 8.5% by mass of silicon carbide, as in the case of the placement plate, and had a disk-shape having a diameter of 320 mm and a thickness of 4.0 mm.

Next, the placement plate and the supporting plate were bonded and integrated so that the internal electrode for electrostatic attraction was formed therebetween, thereby preparing the electrostatic chuck member. Thereafter, polishing processing was performed so that the entire thickness of the electrostatic chuck member has 1.0 mm and a surface of the placement plate is a flat surface.

Separately, an aluminum temperature control base member having a diameter of 350 mm and a height of 25 mm was prepared by machining processing. Flow channels for circulating a refrigerant was formed inside the temperature control base member. A fixing hole was also formed on the temperature control base member.

Next, a through-hole was formed on the supporting plate, and this through-hole was filled with the conductive adhesive.

Next, a power supply terminal was bonded to the supporting plate via the conductive adhesive. In this case, the conductive adhesive was heated at 150° C. for 1 hour, the conductive adhesive was cured, and thereby the conductive adhesive layer was formed.

Next, an adhesive consisting of a silicone-based resin composition is applied to a predetermined region of one main surface of the temperature control base member. Thereafter, the electrostatic chuck member and the temperature control base member to which the adhesive was applied were overlapped. In this case, the power supply terminal was inserted into the fixing hole of the temperature control base member.

Next, the electrostatic chuck member was pressed against the temperature control base member with a pressure of 35 kg and was maintained at 50° C. for 5 hours. Thereafter, the pressed electrostatic chuck member and temperature control base member were heated at 110° C. for 12 hours, and the electrostatic chuck member and the temperature control base member were bonded and integrated with each other.

Next, a surface of the placement plate is subjected to polishing processing to be a flat surface, and then the surface is subjected to blasting processing to form an annular projection portion having a width of 500 µm and a height of 30 µm on a peripheral portion of the surface. In addition, a plurality of columnar projection portions each having a diameter of 500 µm and a height of 30 µm were formed in a region of the surface surrounded by the annular projection portion. Therefore, a region of the surface excavated by blasting processing, that is, a region excluding the annular projection portion and the plurality of projection portions became a flow channel of a sealing medium.

Through the steps above described, the electrostatic chuck device of Example 1 was obtained.

(Measurement of Leak Amount of Helium Gas in Electrostatic Chuck Device)

The electrostatic chuck device was operated, and an evaluation was performed such that a case where a leak amount of helium gas in a cooling gas after 1000 hours was lower than 5 sccm was evaluated as "O (Possible)", and a case where the leak amount of 5 sccm or higher was evaluated as "X (Impossible)". An environmental temperature when measuring the leak amount of the helium gas was room temperature (23° C.). The results are shown in Table 1. The leak amount of the helium gas was confirmed from a difference in an amount of the helium gas leaked to an outside of the electrostatic chuck device at beginning of operation and after 1000 hours.

Example 2

A conductive adhesive of Example 2 was obtained in the same manner as in Example 1, except that 4% by volume of a carbon nanotube (fiber diameter: 120 nm, fiber length 23.4 µm, aspect ratio (fiber length/fiber diameter): 195) were added to 96% by volume of a silicone resin (trade name: TSE-3221, manufactured by Momentive Performance Materials Japan LLC).

In the same manner as in Example 1, a volume resistivity of the conductive adhesive of Example 2, and a shearing strength and strain amount of the conductive adhesive layer of Example 2 were measured. The results are shown in Table 1.

In addition, an electrostatic chuck device of Example 2 was prepared in the same manner as in Example 1 and a leak amount of helium gas in the electrostatic chuck device was measured. The results are shown in Table 1.

Example 3

A conductive adhesive of Example 3 was obtained in the same manner as in Example 1, except that 10% by volume of a carbon nanotube (fiber diameter: 120 nm, fiber length 23.4 µm, aspect ratio (fiber length/fiber diameter): 195) were added to 90% by volume of a silicone resin (trade name: TSE-3221, manufactured by Momentive Performance Materials Japan LLC).

In the same manner as in Example 1, a volume resistivity of the conductive adhesive of Example 3, and a shearing strength and strain amount of the conductive adhesive layer of Example 3 were measured. The results are shown in Table 1.

In addition, an electrostatic chuck device of Example 3 was prepared in the same manner as in Example 1 and a leak amount of helium gas in the electrostatic chuck device was measured. The results are shown in Table 1.

Example 4

A conductive adhesive of Example 4 was obtained in the same manner as in Example 1, except that 15% by volume of a carbon nanotube (fiber diameter: 120 nm, fiber length 23.4 µm, aspect ratio (fiber length/fiber diameter): 195) were added to 85% by volume of a silicone resin (trade name: TSE-3221, manufactured by Momentive Performance Materials Japan LLC).

In the same manner as in Example 1, a volume resistivity of the conductive adhesive of Example 4, and a shearing strength and strain amount of the conductive adhesive layer of Example 4 were measured. The results are shown in Table 1.

In addition, an electrostatic chuck device of Example 4 was prepared in the same manner as in Example 1 and a leak amount of helium gas in the electrostatic chuck device was measured. The results are shown in Table 1.

Comparative Example 1

As the conductive adhesive, a conductive resin (trade name: Duralco 120, manufactured by TAIYO WIRE CLOTH CO., LTD.) containing 30% by volume of a epoxy resin and 70% by volume of spherical silver particles was used.

In the same manner as in Example 1, a volume resistivity of the conductive adhesive of Comparative Example 1, and a shearing strength and strain amount of the conductive adhesive layer of Comparative Example 1 were measured. The results are shown in Table 1.

In addition, an electrostatic chuck device of Comparative Example 1 was prepared in the same manner as in Example 1 and a leak amount of helium gas in the electrostatic chuck device was measured. The results are shown in Table 1.

Comparative Example 2

A conductive adhesive of Comparative Example 2 was obtained in the same manner as in Example 1, except that 4% by volume of a carbon nanotube (fiber diameter: 150 nm, fiber length 8 µm, aspect ratio (fiber length/fiber diameter): 53) were added to 96% by volume of a silicone resin (trade name: TSE-3221, manufactured by Momentive Performance Materials Japan LLC).

In the same manner as in Example 1, a volume resistivity of the conductive adhesive of Comparative Example 2, and a shearing strength and strain amount of the conductive adhesive layer of Comparative Example 2 were measured. The results are shown in Table 1.

In addition, an electrostatic chuck device of Comparative Example 2 was prepared in the same manner as in Example 1 and a leak amount of helium gas in the electrostatic chuck device was measured. The results are shown in Table 1.

Comparative Example 3

20% by volume of a carbon nanotube (fiber diameter: 120 nm, fiber length 23.4 µm, aspect ratio (fiber length/fiber diameter): 195) were added to 80% by volume of a silicone resin (trade name: TSE-3221, manufactured by Momentive Performance Materials Japan LLC), and the obtained composition was a composition of the silicone resins and carbon nanotubes.

However, this composition was not kneaded with a planetary centrifugal mixer.

In addition, this composition was extremely hard and was not uniformly applied to the corresponding location of the electrostatic chuck device. Thus, the composition was not used for the evaluation.

Reference Example

A silicone resin (trade name: TSE-3221, manufactured by Momentive Performance Materials Japan LLC) was heated at 150° C. for 1 hour to be cured.

With respect to the obtained cured product, a volume resistivity, shearing strength, and strain amount were measured in the same manner as in Example 1. The results are shown in Table 1.

From the results in Table 1, in a case of comparing Example 1 to Example 4 with Comparative Example 1 to Comparative Example 3, Example 1 to Example 4 have small leak amounts of helium gas due to repeated use. Therefore, it was found that a cohesive failure of the conductive adhesive due to repeated use was prevented and the electrostatic attraction force of the electrostatic chuck device was prevented from decreasing.

In addition, in a case of comparing Example 3 with Example 4, it was found that the characteristics of the electrostatic chuck devices of these Examples are almost the same, although the amounts of carbon nanotubes are different. It is considered that the needle-like carbon nanotubes come into contact with each other to form conductive paths even though the content of the carbon nanotubes in the conductive adhesive layer is small, so that the volume resistivity of the conductive adhesive layer is lowered, and that in a case where the content of the carbon nanotubes is 10% by volume and 15% by volume, the volume resistivity is already saturated, so that the same results are obtained.

In addition, in Comparative Example 3 in which the content of carbon nanotubes is larger (20% by volume) than Example 3 and Example 4, it is presumed that the carbon nanotubes the needle-like carbon nanotubes, but the friction between the carbon nanotubes increases and the carbon nanotubes are likely to become entangled with each other. Therefore, it is considered that the viscosity of the composition sharply increased and the mixing is impossible. Therefore, the conductive adhesive layer having a predetermined form was not formed, and was not subjected to the evaluation.

In addition, the following points were found by comparing Example 2 with Comparative Example 2. That is, it was found that in a case where the fiber diameters of the carbon nanotubes are the same, the aspect ratios of the carbon nanotubes are small, and the contents of the carbon nanotubes in the conductive adhesive layer are the same, the volume resistivity of the conductive adhesive layer in Comparative Example 2 using the carbon nanotubes having the small aspect ratio was increased. It is presumed that in a case where the aspect ratio of the carbon nanotubes is not large to some extent, sufficient conductive paths cannot be formed, so that the volume resistivity of the conductive adhesive layer in Comparative Example 2 in which the aspect ratio of the carbon nanotubes is small is increased.

TABLE 1

| | Composition of conductive adhesive | Fiber diameter of carbon fiber [nm] | Fiber length of carbon fiber [µm] | Aspect ratio of carbon fiber | Content of carbon fiber [% by volume] | Volume resistivity of conductive adhesive layer [Ω · cm] | Shearing strength of conductive adhesive layer [MPa] | Strain amount of conductive adhesive layer [%] | Leak of helium gas |
|---|---|---|---|---|---|---|---|---|---|
| Example 1 | CNT/Silicone resin | 80 | 10 | 125 | 4 | 5.6 | 2.3 | 366 | ○ |
| Example 2 | CNT/Silicone resin | 120 | 23.4 | 195 | 4 | 221 | 2.0 | 265 | ○ |
| Example 3 | CNT/Silicone resin | 120 | 23.4 | 195 | 10 | 2.1 | 1.5 | 219 | ○ |
| Example 4 | CNT/Silicone resin | 120 | 23.4 | 195 | 15 | 2 | 1.1 | 200 | ○ |
| Comparative Example 1 | Spherical silver particles/Epoxy resin | — | — | — | — | $8 \times 10^{-5}$ | 70 | 5 | X |
| Comparative Example 2 | CNT/Silicone resin | 150 | 8 | 53 | 4 | $4.4 \times 10^3$ | — | — | — |
| Comparative Example 3 | CNT/Silicone resin | 120 | 23.4 | 195 | 20 | — | — | — | — |
| Reference Example | Silicone resin | — | — | — | — | $6 \times 10^{13}$ | 2.3 | 414 | |

INDUSTRIAL APPLICABILITY

It is possible to provide an electrostatic chuck device that prevents a cohesive failure of a conductive adhesive due to repeated use.

REFERENCE SIGNS LIST 1, 100: electrostatic chuck device
2: electrostatic chuck member
3: temperature control base member
4: adhesive layer
11: placement plate
11a: placement surface of placement plate
12: supporting plate
13: electrode for electrostatic attraction
14: insulating material
15: fixing hole
16: power supply terminal
17: conductive adhesive layer
18: through-hole
21: flow channel
22: high frequency power supply
23: insulating material
24: direct-current power supply
110: electrode-side power supply terminal for electrostatic attraction
200: adherend
300: conductive adhesive layer
400: sample for shearing test
A: length of adherend
B: width of adherend
C: thickness of adherend
D: length of conductive adhesive layer
E: thickness of conductive adhesive layer

The invention claimed is:

1. An electrostatic chuck device comprising:
an electrostatic chuck member formed of ceramics;
a temperature control base member formed of metal; and
a power supply terminal which is inserted in the temperature control base member and applies a voltage to an electrode for electrostatic attraction which is provided on the electrostatic chuck member,
wherein
the electrode for electrostatic attraction and the power supply terminal are connected with each other via a conductive adhesive layer,
the conductive adhesive layer contains a carbon fiber and a resin, and
the carbon fiber has an aspect ratio of 100 or higher.

2. The electrostatic chuck device according to claim 1, wherein the carbon fiber has a fiber diameter of 10 nm or higher and 200 nm or lower, and a fiber length of 5 μm or higher and 200 μm or lower.

3. The electrostatic chuck device according to claim 1, wherein the carbon fiber has an aspect ratio of 220 or lower.

4. The electrostatic chuck device according to claim 1, wherein a content of the carbon fibers in the conductive adhesive layer is 4% by volume or more and 15% by volume or less.

5. The electrostatic chuck device according to claim 1, wherein the resin is a silicone resin.

6. The electrostatic chuck device according to claim 1, wherein the conductive adhesive layer has 1000 Ω·cm or lower of a volume resistivity at room temperature, 1 MPa or higher and 10 MPa or lower of a shearing strength at 150° C., and 100% or more and 400% or less of a strain amount.

7. The electrostatic chuck device according to claim 1, wherein the conductive adhesive layer consists of the carbon fiber and a silicone resin,
the carbon fiber is a carbon nanotube,
the carbon fiber has a fiber diameter of 50 nm or higher and 150 nm or lower, a fiber length of 5 μm or higher and 50 μm or lower, and an aspect ratio of 100 or higher and 220 or lower,
a content of the carbon fibers in the conductive adhesive layer is 8% by volume or more and 15% by volume or less, and
the resin is a silicone resin.

8. The electrostatic chuck device according to claim 1, wherein a thickness of the adhesive layer is 100 μm or higher and 200 μm or lower.

9. The electrostatic chuck device according to claim 1, wherein the carbon fiber consists of a carbon nanotube.

10. The electrostatic chuck device according to claim 1, wherein a content of the carbon fibers in the conductive adhesive layer is 4% by volume or more and 18% by volume or less.

11. The electrostatic chuck device according to claim 1, wherein the fiber diameter and the fiber length are average values of fiber diameters and the fiber lengths of 100 carbon fibers.

* * * * *